(12) United States Patent
Trice et al.

(10) Patent No.: US 12,166,357 B2
(45) Date of Patent: Dec. 10, 2024

(54) UNDER-CABINET WIRELESS POWER SYSTEM

(71) Applicant: Midea Group Co., Ltd., Foshan (CN)

(72) Inventors: Daniel J. Trice, Louisville, KY (US); Brian Langness, Shelbyville, KY (US); Clayton James O'Donoghue, Shelbyville, KY (US); John Kenneth Hooker, Louisville, KY (US)

(73) Assignee: MIDEA GROUP CO., LTD., Guangdong (CN)

( * ) Notice: Subject to any disclaimer, the term of this patent is extended or adjusted under 35 U.S.C. 154(b) by 11 days.

(21) Appl. No.: 18/145,721

(22) Filed: Dec. 22, 2022

(65) Prior Publication Data

US 2024/0213801 A1 Jun. 27, 2024

(51) Int. Cl.
*H02J 50/00* (2016.01)
*A47B 57/06* (2006.01)
*H05K 5/00* (2006.01)
*H05K 5/02* (2006.01)

(52) U.S. Cl.
CPC ............ *H02J 50/005* (2020.01); *A47B 57/06* (2013.01); *H05K 5/0017* (2013.01); *H05K 5/0204* (2013.01); *H05K 5/0217* (2013.01); *A47B 2220/0091* (2013.01)

(58) Field of Classification Search
None
See application file for complete search history.

(56) References Cited

U.S. PATENT DOCUMENTS

| | | | |
|---|---|---|---|
| 9,413,175 B2 | 8/2016 | Park et al. | |
| 9,484,751 B2 | 11/2016 | Byrne et al. | |
| 9,955,529 B2 | 4/2018 | Baarman et al. | |
| 10,424,940 B2 | 9/2019 | Nam et al. | |
| 10,554,033 B2 | 2/2020 | Girdzis | |
| 2010/0264747 A1* | 10/2010 | Hall | B60L 53/665 |
| | | | 307/104 |
| 2014/0191641 A1* | 7/2014 | Marsters | A47B 46/005 |
| | | | 312/246 |

FOREIGN PATENT DOCUMENTS

| | | | |
|---|---|---|---|
| CN | 104545034 A | 4/2015 | |
| CN | 107822343 A | 3/2018 | |
| CN | 110916373 A | 3/2020 | |
| CN | 210809967 U | 6/2020 | |
| CN | 112586909 A | 4/2021 | |
| WO | WO-2023241779 A1 * | 12/2023 | ............ H02J 50/005 |

OTHER PUBLICATIONS

Related Applications Transmittal Apr. 17, 2023.
Shengshi Wireless Power; "Invisible Wireless Charger, Wireless Charger for Furniture, 45 millimeter Long Distance Under Table Charger for Deluxe Edition"; retrieved from http://www.shengshiwireless.com/en/product-detail/bEQa3wZb; Shengshi Wireless Power; retrieved on Nov. 2, 2022.
Corda, Victor; "The Wireless Power Consortium's Wireless Kitchen Appliances Concept"; retrieved from https://www.qiwireless.com/wireless-power-consortiums-wireless-kitchen-appliances-concept/; QiWireless; dated Apr. 20, 2014.

* cited by examiner

*Primary Examiner* — Jared Fureman
*Assistant Examiner* — Aqeel H Bukhari
(74) *Attorney, Agent, or Firm* — Gray Ice Higdon

(57) ABSTRACT

An under-cabinet wireless power system is mountable to an underside of a wall cabinet that is positioned over a countertop and includes a wireless power transmitter capable of powering a wirelessly powered appliance positioned proximate thereto.

20 Claims, 6 Drawing Sheets

UNDER-CABINET WIRELESS POWER SYSTEM

BACKGROUND

A wide variety of kitchen appliances are commonly used in single-family and multi-family residential applications. Many of these appliances, e.g., dishwashers, wine coolers, refrigerators, laundry washing machines, ovens, ranges, cooktops, etc., are installed in a "built-in" fashion such as under a countertop, within a cut-out formed in the countertop, or in a designated opening in the arrangement of kitchen cabinets. Built-In appliances are often hard-wired into a household electrical circuit or are plugged in to a dedicated electrical outlet that is generally hidden from view when the appliance is in its installed location.

Many consumers, however, also rely on various smaller kitchen appliances to perform more specific tasks, including, for example, microwave ovens, rice cookers, blenders, mixers, food processors, toasters, air fryers, pressure cookers, coffee makers, espresso machines, etc. While sometimes these appliances are stored on the countertop when not in use, in other instances these appliances may be stored in the cabinets or elsewhere and brought out when needed. To power such devices, many kitchens include electrical outlets on the wall between the upper cabinets and the countertop, which is often referred to as a backsplash, so that such appliances may be plugged in when needed. The power cords used by such appliances, however, can be cumbersome and unsightly, both during use and in storage.

More recently, it has been proposed to use wireless power for smaller kitchen appliances, e.g., based upon the Ki Kitchen Cordless Standard developed by the Wireless Power Consortium. Rather than relying on a power cord plugged into an electrical outlet, a wirelessly-powered appliance includes a wireless power receiver that is oriented on the bottom of the appliance to receive power wirelessly from a wireless power transmitter that is embedded in a cooktop, a countertop or table when the appliance is positioned directly over the wireless power transmitter.

Integrating a wireless power transmitter into a countertop or table in an existing kitchen, however, can be problematic and expensive. Many wireless power transmitters, for example, are intended to be installed underneath or within a countertop and are hard-wired into a household electrical circuit, so existing countertops may need to be removed, and new wiring run, in order to retrofit a kitchen for wireless power. Therefore, a substantial need exists in the art for a more cost effective and convenient manner of supplying power to a wirelessly powered appliance, particularly in an existing kitchen.

SUMMARY

The herein-described embodiments address these and other problems associated with the art by providing an under-cabinet wireless power system that is mountable to an underside of a wall cabinet that is positioned over a countertop and that includes a wireless power transmitter capable of powering a wirelessly powered appliance positioned proximate thereto. In some instances, the wireless power transmitter may be disposed on a movable platform that is movable between storage and use positions relative to a fixed base that is mounted to the wall cabinet, such that the movable platform may be moved out of the way when not in use, thereby reducing clutter and clearing the countertop for other uses.

Therefore, consistent with one aspect of the invention, a under-cabinet wireless power system may include a base configured to mount to an underside of a wall cabinet that is positioned over a countertop, and a wireless power transmitter supported by the base and configured to generate a wireless power signal to power a wirelessly powered appliance positioned proximate thereto.

Some embodiments may also include a movable platform movably coupled to the base, where the wireless power transmitter is disposed on the movable platform. Also, in some embodiments, the movable platform is at least partially linearly movable relative to the base. In addition, some embodiments may further include a scissors mechanism coupling the movable platform to the base.

Further, in some embodiments, the movable platform is at least partially pivotably movable relative to the base. Some embodiments may further include at least one rotatable coupling configured to pivot the movable platform relative to the base. In some embodiments, the at least one rotatable coupling includes a first rotatable coupling pivotably coupling the movable platform to the base. In addition, some embodiments may also include a pivot mechanism disposed intermediate the base and the movable platform and including the at least one rotatable coupling, and the at least one rotatable coupling includes a first rotatable coupling pivotably coupling the pivot mechanism to the base proximate a first opposing end of the pivot mechanism and a second rotatable coupling pivotably coupling the pivot mechanism to the movable platform proximate a second opposing end of the pivot mechanism. In some embodiments, the pivot mechanism includes at least one extendible leg extending between the base and the movable platform.

In addition, in some embodiments, the movable platform is movable between a storage position and a use position. Moreover, in some embodiments, when in the use position the wireless power transmitter is upwardly-facing to oppose a downwardly-facing wireless power receiver of the wirelessly powered appliance. In some embodiments, when in the use position the wireless power transmitter is downwardly-facing to oppose an upwardly-facing wireless power receiver of the wirelessly powered appliance. Moreover, in some embodiments, when in the use position the wireless power transmitter is side-facing to oppose a side-facing wireless power receiver of the wirelessly powered appliance.

In some embodiments, when in the storage position at least a portion of the movable platform nests within the base. In addition, in some embodiments, at least a portion of the base nests within a downwardly-facing enclosed area of the wall cabinet formed in part by a face frame of the wall cabinet. Some embodiments may also include a power cord configured to supply power to the wireless power transmitter from a wall-mounted electrical outlet. Some embodiments may further include a mounting bracket configured to mount the base to the underside of the wall cabinet.

In addition, some embodiments may further include a secondary function configured for use when the wireless power transmitter is not active. In some embodiments, the secondary function includes an on/off light, a motion activated light, a timed light, a light sensor-activated light, a smart assistant, a video system, a display, a touchscreen display, a clock, a timer, or an audio system. In addition, some embodiments may also include a user interface and a controller configured to operate the user interface and the wireless power transmitter, and the controller is further configured to control a functional operation of the wirelessly powered appliance using the interface.

Other embodiments may include various methods for making and/or using any of the aforementioned constructions.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

DETAILED DESCRIPTION

Figure 1:
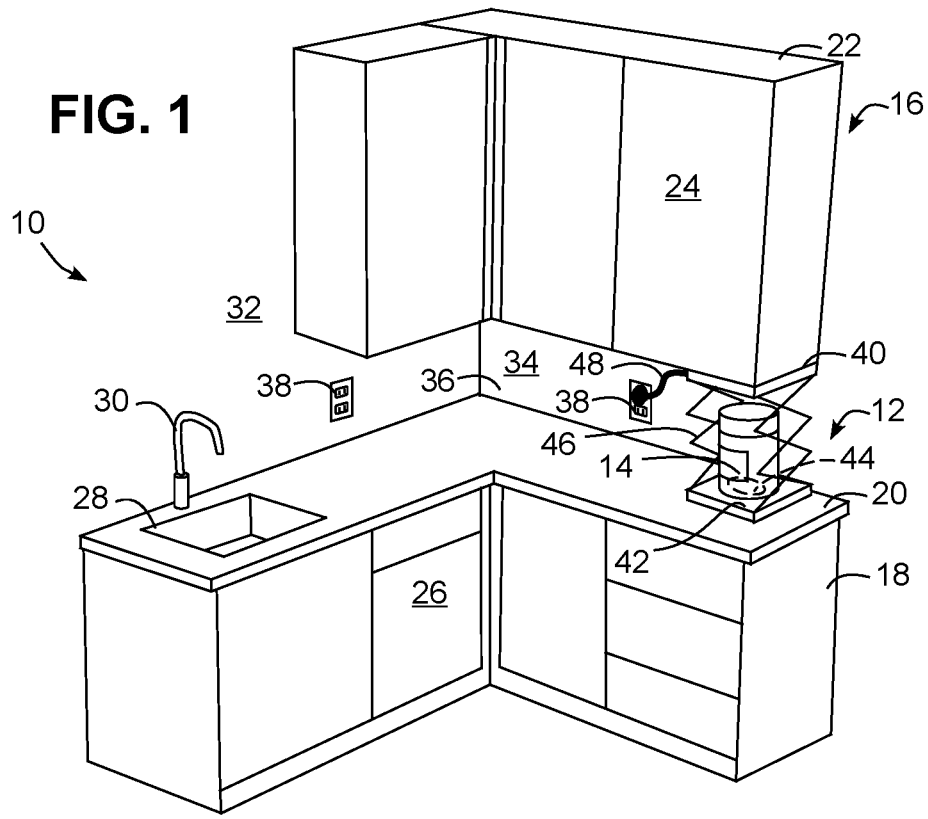
FIG. 1 is a perspective view of a room incorporating an under-cabinet wireless power system consistent with some embodiments of the invention.

Turning now to the drawings, wherein like numbers denote like parts throughout the several views, FIG. 1 illustrates an example room (e.g., a kitchen) 10 within which is installed an under-cabinet wireless power system 12 suitable for powering one or more wirelessly powered appliances, e.g., a wirelessly powered pressure cooker 14. Room 10 includes a built-in cabinet system 16, which includes one or more base cabinets 18 that support a countertop 20 and one or more upper or wall cabinets 22 that are positioned over countertop 20. Cabinets 18, 22 may include doors, e.g., door 24, in some instances, or may include drawers or open shelves, and it will be appreciated that in some instances, various built-in appliances (e.g., dishwasher 26) may also be mounted or positioned within built-in cabinet system 16 (other appliances include, but are not limited to, refrigerators, ovens, ranges, cooktops, laundry washing machines, dryers, etc.) One or more sinks 28 may also be disposed on countertop 20 and may be supplied with water by a faucet 30.

Cabinets 18, 22 are generally secured along one or more walls 32, 34 in room 10, with wall cabinets 22 generally mounted to walls 32, 34 and positioned above counter height, e.g., above countertop 20, which is supported by base cabinets 18. In the United States, for example, the countertop may be at a height (from the floor) of approximately 36 inches with the wall cabinets at a height (from the floor) of approximately 54 inches, such that the wall area between the countertop and the bottom of the wall cabinets, referred to herein as a backsplash 36, has a height (from the countertop to the bottom of the wall cabinets) of approximately 18 inches. Base cabinets 18 may or may not be secured to walls 32, 34, but are otherwise generally floor standing such that their load is predominantly borne by the floor rather than a wall, which is generally the case for wall cabinets 22.

It will be appreciated that other countertop, wall cabinet, and backsplash heights may be used in other embodiments. It will also be appreciated that room 10 may be any suitable living or working space within which may be provided built-in cabinets including one or more wall cabinets positioned over a countertop, and within which it may be desired to use a wirelessly powered appliance. Example types of suitable rooms include a kitchen, bar, entertainment area, office area, retail establishment, etc. In some embodiments, room 10 may even be disposed within a boat or recreational vehicle.

Room 10 may also include one or more electrical outlets 38, e.g., disposed on walls 32, 34. In many kitchens, for example, electrical outlets are positioned at various points along a backsplash 36 to provide users with multiple locations within which to plug in various small, portable and/or countertop appliances.

Under-cabinet wireless power system 12, in the illustrated embodiments, is mounted and supported at least in part by an upper cabinet 22. In the embodiment of FIG. 1, for example, under-cabinet wireless power system 12 includes a fixed base 40 that is mounted to upper cabinet 22, and a movable platform 42 that includes a wireless power transmitter 44 (occluded by pressure cooker 14 in FIG. 1) and that is movably supported by a scissor mechanism 46. A power cord 48, plugged into an electrical outlet 38, supplies power to under-cabinet wireless power system 12, although in other embodiments the under-cabinet wireless power system may be hard-wired.

When not in use, movable platform 42 may be pushed up proximate to or in contact with fixed base 40, and scissor mechanism 46 may be collapsed into one or both of fixed base 40 and movable platform 42 to present a clean and uncluttered appearance in the storage position. Then, when it is desirable to use wirelessly powered appliance 14, movable platform 42 may be pulled downwardly from fixed base 40, extending scissor mechanism 46, and exposing wireless power transmitter 44. Wirelessly powered appliance 14 may then be placed on movable platform 42 in alignment with wireless power transmitter pad 44, and power may be supplied to the wirelessly powered appliance. In some embodiments, movable platform 42 may be pulled down until it is supported on countertop 20 such that wirelessly powered appliance 14 is effectively supported on countertop 20, while in other embodiments, movable platform 42 may extend only partially towards the countertop, whereby the weight of wirelessly powered appliance 14 would be supported by under-cabinet wireless power system 12.

Figure 2:
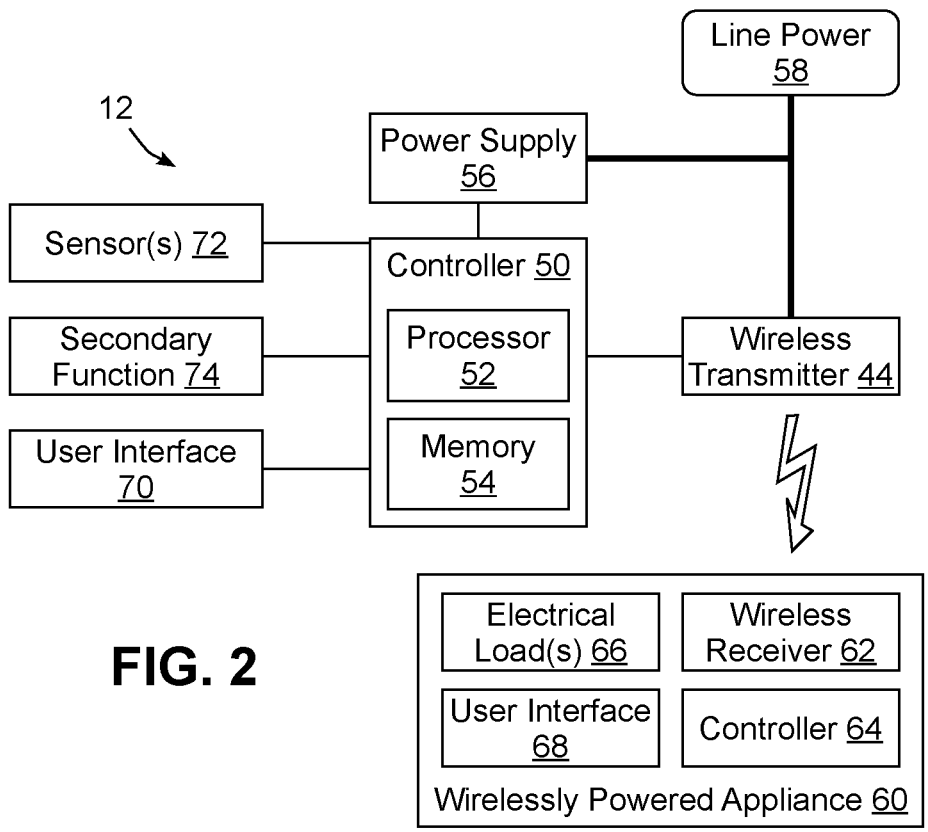
FIG. 2 is a block diagram of an example control system for the under-cabinet wireless power system of FIG. 1.

Now turning to FIG. 2, under-cabinet wireless power system 12 may be under the control of a controller 50 that receives inputs from a number of components and drives a number of components in response thereto. Controller 50 may, for example, include one or more processors 52 and a memory 54 within which may be stored program code for execution by the one or more processors. The memory may be embedded in controller 50, but may also be considered to include volatile and/or non-volatile memories, cache memories, flash memories, programmable read-only memories, read-only memories, etc., as well as memory storage physically located elsewhere from controller 50, e.g., in a mass storage device or on a remote computer interfaced with controller 50. Controller 50 may also be implemented at least in part using discrete circuit logic, as will be appreciated by those of ordinary skill having the benefit of the instant disclosure.

As shown in FIG. 2, controller 50 may be powered by a power supply 56, e.g., an AC-DC power supply that is coupled to line power 58 (e.g., 120-240 VAC, as may be provided by a residential electrical circuit), via an electrical outlet and plug, or alternatively, a hard-wired connection. Line power 58 also supplies wireless power transmitter 44 with power. Controller 50 may control wireless power transmitter 44 to selectively activate/deactivate the wireless power transmitter, to regulate the power output of the wireless power transmitter, to communicate data to and/or receive data from wirelessly powered appliance 14, etc. In the illustrated embodiment, wireless power transmitter 44 is compatible with the Ki Kitchen Cordless Standard developed by the Wireless Power Consortium, although other wireless power or charging standards may be used in other embodiments, including, for example, the Qi Wireless Charging Standard also developed by the Wireless Power Consortium. It will be appreciated that the control over wireless power transmitter 44 by controller 50 to emit a wireless power signal would be well within the abilities of those of ordinary skill having the benefit of the instant disclosure.

A wirelessly powered appliance 60 (of which pressure cooker 14 of FIG. 1 is an example) may include a wireless power receiver 62 that, when positioned proximate wireless power transmitter 44, receives a wireless power signal to supply power to the wirelessly powered appliance. Wirelessly powered appliance 60 may also include a controller 64 to operate wireless power receiver 62, as well as to perform other appliance-related functions. Power received by wireless power receiver 62 may be used to also power one or more electrical loads 66, e.g., motors, heating elements, displays, etc., as well as controller 64 itself.

In some embodiments, wirelessly powered appliance 60 may include a user interface 68 to operate the appliance, and, beyond the supply of wireless power, may operate completely independently from under-cabinet wireless power system 12. In other embodiments, however, under-cabinet wireless power system 12 may be functionally integrated with wirelessly powered appliance 60, e.g., such that a user interface 70 of under-cabinet wireless power system 12 is used to display information received from wirelessly powered appliance 60 and/or control one or more functional operations of wirelessly powered appliance 60 beyond simply controlling the supply of power to the wirelessly powered appliance. In some embodiments, for example, wirelessly powered appliance 60 may omit any separate user interface, and may be operated through user interface 70 of under-cabinet wireless power system 12. Communication between under-cabinet wireless power system 12 and wirelessly powered appliance 60 may be over a Near Field Communication (NFC) wireless link as supported by the Ki standard, or via a separate wired or wireless network.

It may also be desirable to provide one or more sensors 72 for sensing various states associated with the under-cabinet wireless power system 12. For example, a position sensor may be used in some embodiments to detect when under-cabinet wireless power system is in a storage and/or use configuration, e.g., to automatically turn the under-cabinet wireless power system on or off when it is transitioned between the storage and use configurations. In addition, a temperature sensor and/or current may be used in some embodiments to monitor wireless power transfer and prevent overheating. Other suitable sensors will be appreciated by those of ordinary skill having the benefit of the instant disclosure.

In addition, as will be discussed in greater detail below, under-cabinet wireless power system 12 may also support one or more secondary functions represented at 74. Such secondary functions may include functions that are available to a user when under-cabinet wireless power system 12 is in a storage configuration, is in a use configuration, or both. Non-limiting examples of secondary functions that may be supported by under-cabinet wireless power system 12 include lights (including on/off, motion activated, or night lights), clocks, kitchen timers, smart assistants, displays, video systems, audio systems, etc.

An under-cabinet wireless power system consistent with the invention may generally be considered to include at least a base that is mountable to an underside of a wall cabinet that is positioned over a countertop, along with a wireless power transmitter supported by the base and configured to generate a wireless power signal to power a wirelessly powered appliance positioned proximate thereto. A base, in particular, may be considered to be mountable to an underside of a wall cabinet when the base is sized and configured, and in some instances, includes suitable mounting hardware, for securing the base to the underside of a wall cabinet. In some embodiments, a base may be sized to be received on the underside of a standard depth wall cabinet (e.g., about 12 inches in depth), although a base may also be sized to be received on the underside of wall cabinets having other standard depths, e.g., 15, 18, or 24 inches. At least a portion of a base in some embodiments may also be configured to be substantially hidden from view by any structure in a wall cabinet, e.g., a face frame, that extends downwardly below the bottom surface of the wall cabinet, and in some embodiments, at least a portion of a base may be configured to align with a face frame of a wall cabinet, e.g., via a notched edge, such that a face of the base is substantially flush with the face frame.

Mounting may occur through the use of fasteners and/or adhesives, and mounting may be made to any structure of a wall cabinet providing suitable support. Mounting, for example, may be made through the use of threaded fasteners that extend through the bottom of a wall cabinet in some embodiments. In addition, in some embodiments, additional mounting hardware may be used to mount a base to a wall cabinet, e.g., one or more mounting brackets, and in some embodiments a base may be removably attachable to a mounting bracket such that a bracket may first be mounted to a wall cabinet and the base thereafter attached to the mounting bracket to complete the installation. The base and/or mounting bracket may also include, in some embodiments, a structure suitable for hiding a portion of a power cord, e.g., when the base is secured to a wall cabinet directly above an electrical outlet such that any extra length of power cord can be hidden from view.

In addition, in some instances, a wireless power transmitter may be disposed on a movable platform that is movable relative to the base between storage and use positions. When in the use position, the movable platform orients the wireless power transmitter in a convenient location to oppose a wireless power receiver on a wirelessly powered appliance. In some instances, the movable platform may be positioned to support the weight of the wirelessly powered appliance, e.g., when the movable platform is suspended above the countertop, or in other instances, the movable platform may itself be supported on the countertop such that the countertop supports the weight of the moveable platform and the wirelessly powered appliance supported thereby. In still other instances, the movable platform may position the wireless power transmitter to oppose a wireless power receiver of a wirelessly powered appliance when the wirelessly powered appliance is supported directly on the countertop.

When in the storage position, however, the movable platform may be moved out of the way, e.g., nesting at least partially into the fixed base, to reduce clutter and clear the countertop for other uses. Thus, wireless power functionality may be supported in an existing kitchen or other room in a manner that is easily retrofittable and reasonably clutter free.

FIGS. 3-6, for example, illustrate an example pull-down under-cabinet wireless power system 100 consistent with the invention, which is illustrated as mounted to an underside (represented by dashed line 102) of an upper or wall cabinet 104 positioned above a countertop 106 supported by a base cabinet 108. Under-cabinet wireless power system 100 is supplied with power by a power cord 110 that is plugged in to an electrical outlet 112 positioned on a backsplash 114 of a wall 116 to which wall cabinet 104 is mounted.

Under-cabinet wireless power system 100 includes a fixed base 118 and a movable platform 120 that includes a wireless power transmitter 122 and that is movably supported by a scissor mechanism 124. Other manners of providing linear motion to extend movable platform 120 down to countertop 106 may be used in other embodiments, including sliding rails, pistons, etc. It will be appreciated that a bias mechanism may also be provided in some embodiments to bias the movable platform 120 to either its storage position (FIGS. 3 and 5) or use position (FIGS. 4 and 6), and that a damping mechanism, e.g., via one or more cylinders, may also be used to provide controlled movement between the storage and use positions. It may also be desirable to provide a releasable latching mechanism in some embodiments to latch movable platform 120 to fixed base 118 to prevent the movable platform 120 from inadvertently dropping into the use position.

Figure 3:
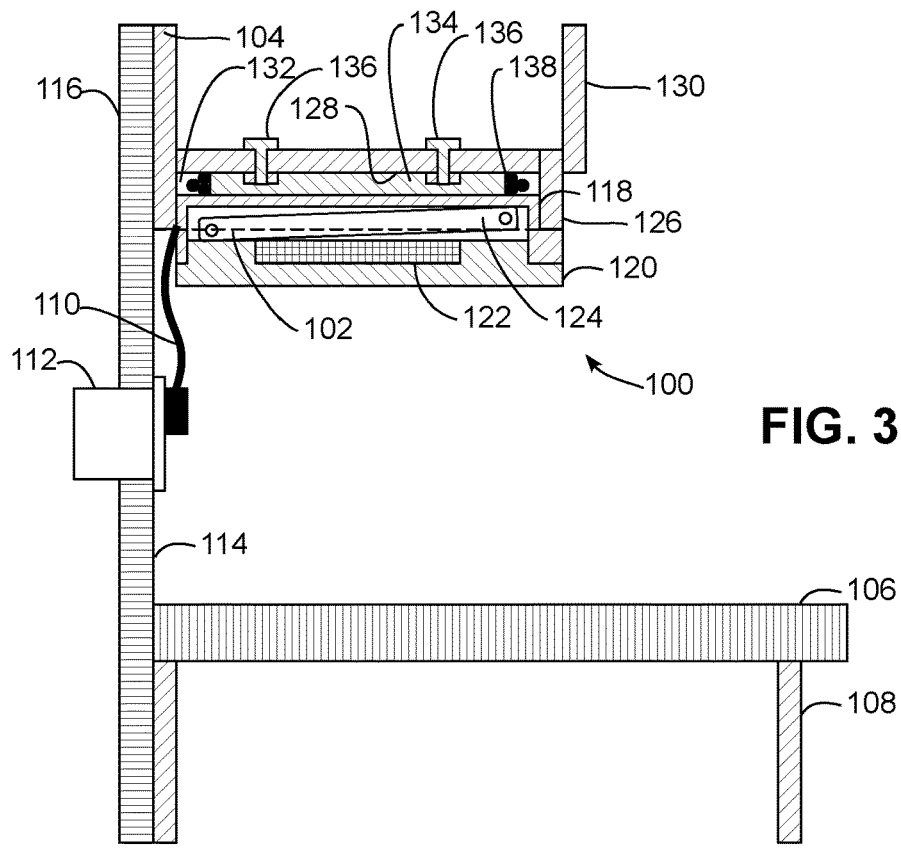
FIGS. 3 and 4 are side cross sectional views of an example pull-down under-cabinet wireless power system consistent with some embodiments of the invention, in storage (FIG. 3) and use (FIG. 4) configurations.
Figure 4:
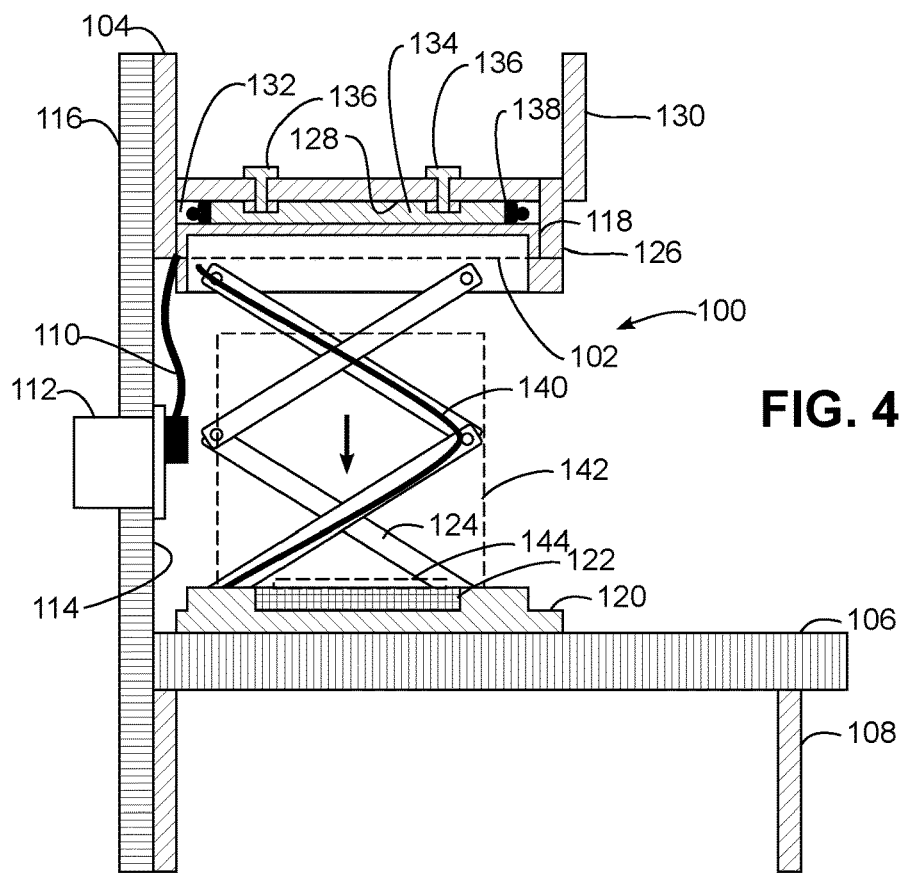
Figure 5:
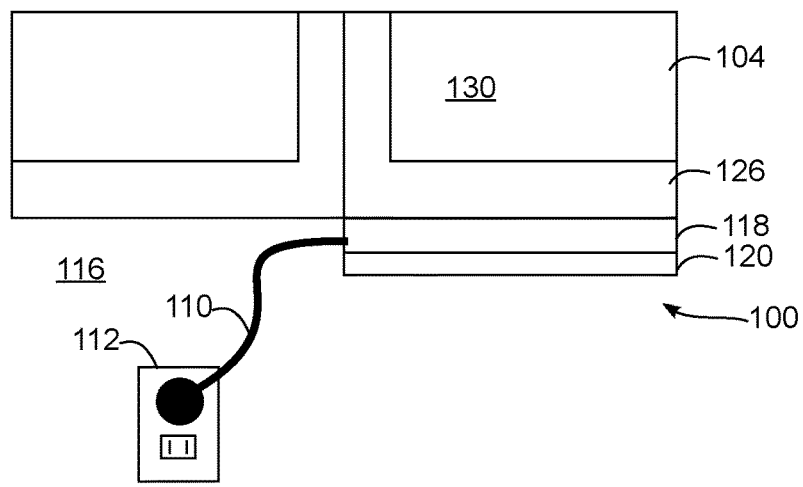
FIGS. 5 and 6 are front elevational views of the example pull-down under-cabinet wireless power system of FIGS. 3-4, in storage (FIG. 5) and use (FIG. 6) configurations.
Figure 6:
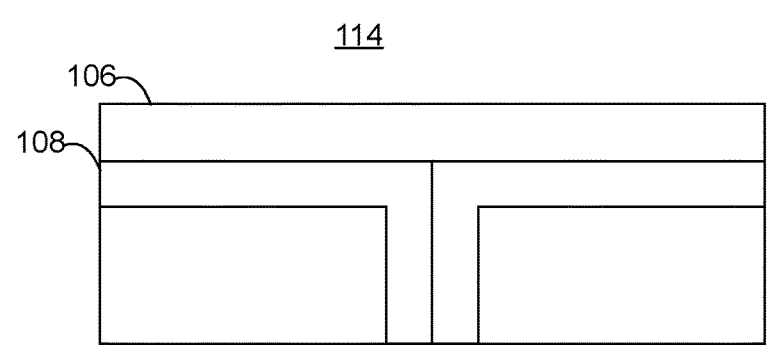
Figure 6:
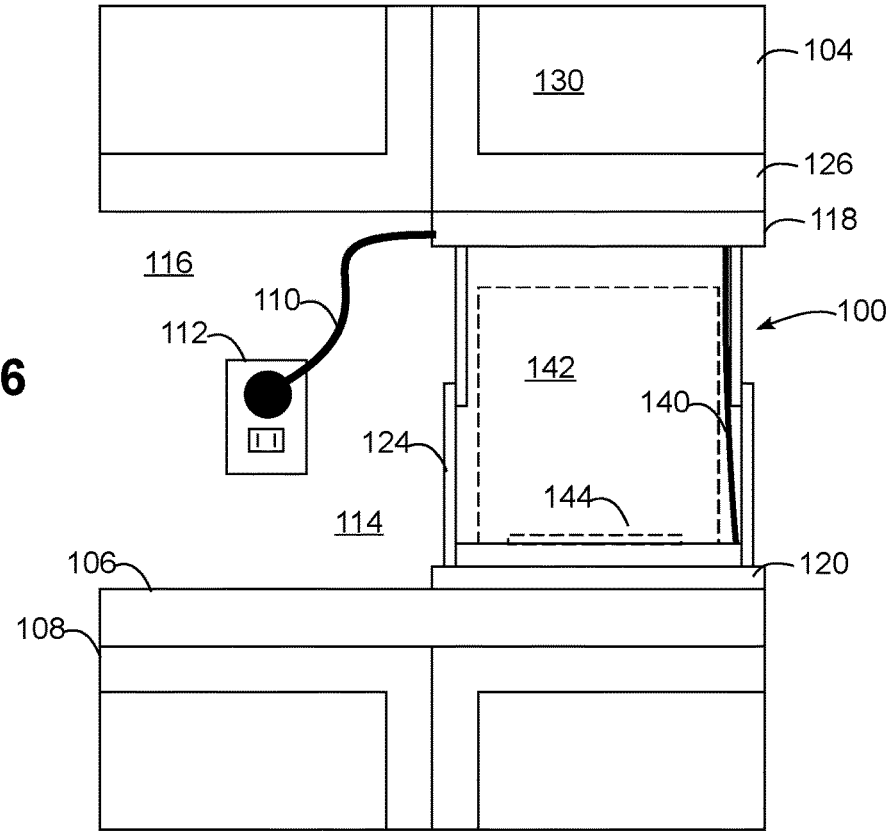

Wall cabinet 104 is illustrated having a face frame 126 that extends below a bottom 128 of wall cabinet 104, as well as forms a face for framing a door 130, such that face frame 126 defines a downwardly-facing enclosed area 132 that is generally not visible to users when in a standing orientation. As such, it may be desirable to design fixed base 118 to nest into this downwardly-facing enclosed area 132 such that at least a portion of the fixed base 118 is hidden by face frame 126. In addition, it may also be desirable to design movable platform 120 to nest into fixed base 118 when in a storage position (FIGS. 3 and 5) to reduce the distance that movable platform extends downwardly from underside 102 of wall cabinet 104. As also illustrated in FIGS. 3 and 5, it may be desirable for aesthetic purposes to design fixed base 118 and/or movable platform 120 to have front surfaces that are substantially flush with face frame 126. It will be appreciated, however, that a wide variety of other profiles and ornamental designs may be used in other embodiments.

Fixed base 118 is mounted to upper cabinet 104 using a mounting bracket 134 that is secured to wall cabinet 104 using a plurality of fasteners 136 (e.g., screws or bolts). In one example embodiment, threaded nuts are mounted to or formed in mounting bracket 134 and fasteners 136 are bolts that are threaded into the threaded nuts in mounting bracket 134 through holes drilled in bottom 128 of wall cabinet 104. Fixed base 118 may then be attached to mounting bracket 134, e.g., through snap-in tabs, fasteners, magnets, rails, etc. Alternatively, no separate mounting bracket may be used, and fasteners 136 may thread directly into nuts mounted to or formed in fixed base 118. It will be appreciated, however, that an innumerable number of other mounting configurations may be used in other embodiments, so the invention is not limited to the particular mounting configurations described herein.

In addition, where under-cabinet wireless power system 100 is powered through a power cord 110, it may also be desirable to provide a space around mounting bracket 134 and/or fixed base 118 to wrap any extra length of power cord (illustrated at 138). Furthermore, when power cord 110 extends to fixed base 118, some or all of the electrical components, other than wireless power transmitter 122, may be disposed in fixed base 118, and a cable 140 (FIGS. 4 and 6) may extend between fixed base 118 and wireless power transmitter 122 to power the wireless power transmitter. In other embodiments, at least some of all of the electrical components may be disposed in movable platform 120, and in other embodiments, all of the electrical components may be disposed in movable platform 120, such that fixed base 118 may not receive any electrical power, and power cord 110 may instead couple to movable platform 120.

In use, under-cabinet wireless power system 100 is normally stored in the configuration illustrated in FIGS. 3 and 5, with movable platform 120 nested within fixed base 118. When it is desired to power a wirelessly powered appliance, movable platform 120 may be pulled down from the storage position (FIGS. 3 and 5) to the use position (FIGS. 4 and 6) and a wirelessly powered appliance 142 may be positioned on movable platform 120 with its wireless power receiver 144 aligned with wireless power transmitter 122. Power may then be supplied to the wirelessly powered appliance 142, e.g., automatically after detection of wireless power receiver 144 by wireless power transmitter 122, or manually after user selection of an "on" function supported by under-cabinet wireless power system 100 or wirelessly powered appliance 142. Once use of wirelessly powered appliance 142 is complete, wirelessly powered appliance 142 may be removed from movable platform 120 and movable platform 120 may then be pushed up into its storage position.

Figure 7:
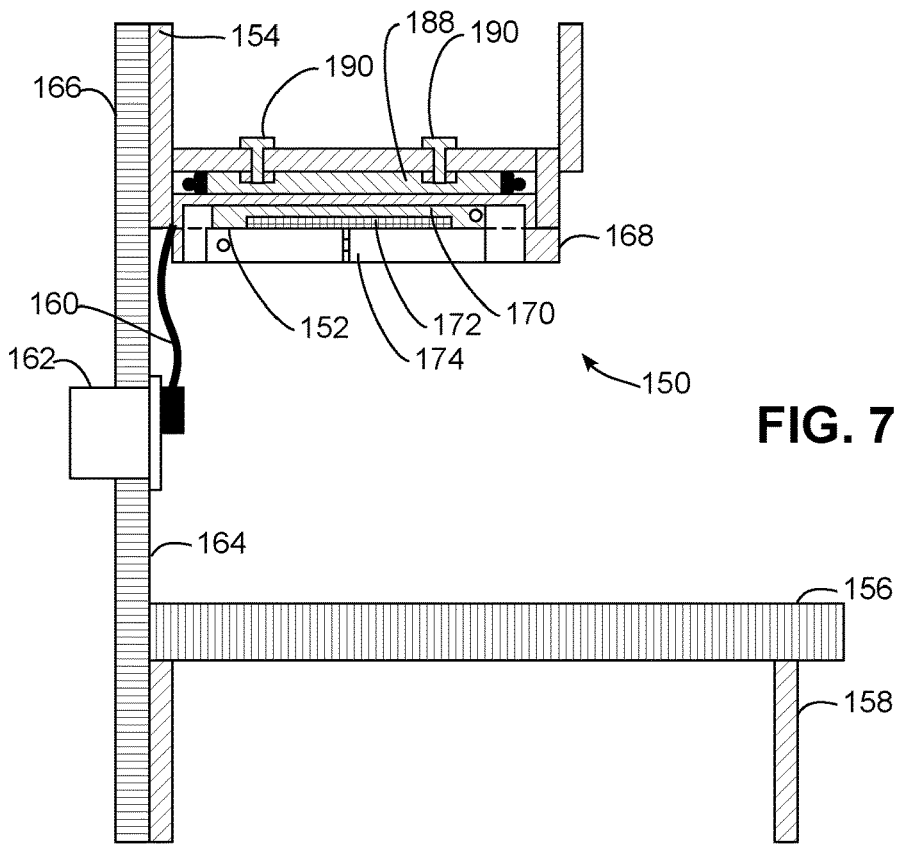
FIGS. 7 and 8 are side cross sectional views of an example tilt-out under-cabinet wireless power system consistent with some embodiments of the invention, in storage (FIG. 7) and use (FIG. 8) configurations.
Figure 8:
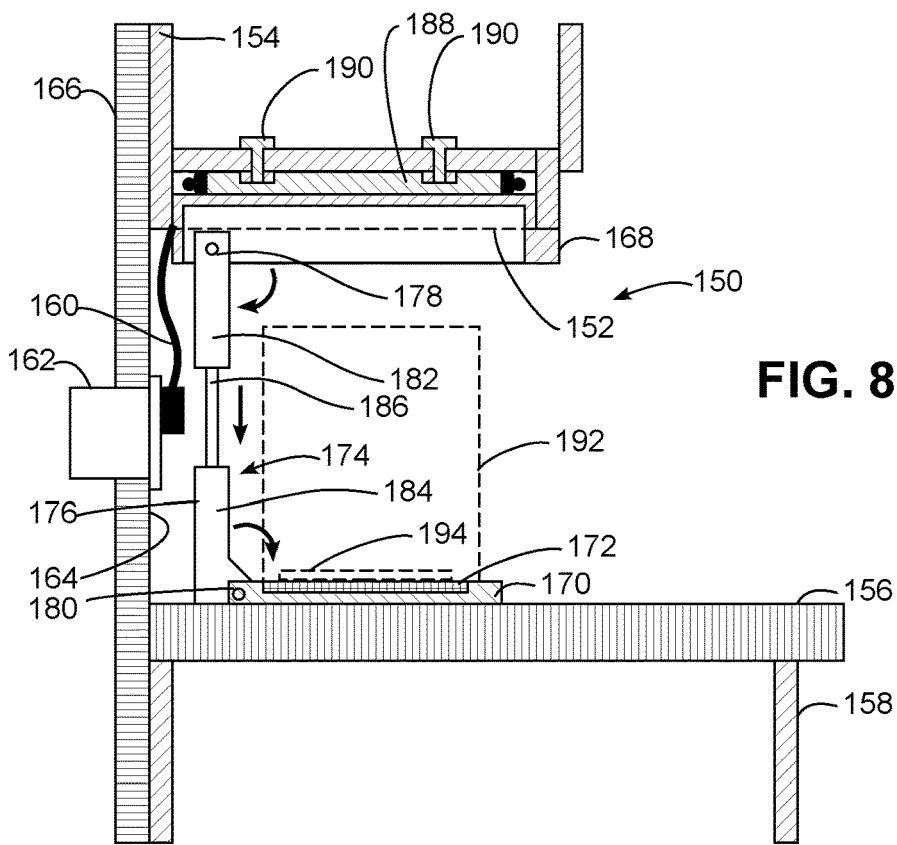

FIGS. 7-8 next illustrate an example tilt-out under-cabinet wireless power system 150 in storage (FIG. 7) and use (FIG. 8) positions. In this embodiment, rather than relying on a scissors mechanism to move a movable platform substantially linearly between the storage and use positions, under-cabinet wireless power system 150 relies in part on rotational movement between components. Under-cabinet wireless power system is illustrated as mounted to an underside (represented by dashed line 152) of an upper or wall cabinet 154 positioned above a countertop 156 supported by a base cabinet 158, and is supplied with power by a power cord 160 that is plugged in to an electrical outlet 162 positioned on a backsplash 164 of a wall 166 to which wall cabinet 154 is mounted.

Under-cabinet wireless power system 150 includes a fixed base 168 and a movable platform 170 that includes a wireless power transmitter 172 and that is movably supported by a pivot mechanism 174 that includes a pair of legs 176 (only one of which is shown in FIGS. 7-8) that are rotatably connected proximate each opposing end to fixed base 168 and movable platform 170 through rotatable couplings 178, 180. In addition, while not required in some embodiments, in the illustrated embodiment each leg 176 is extendible, e.g., using a pair of sleeves 182, 184 slidably joined through a rod 186 that allows for frictional sliding between extended and retracted positions. By providing extendibility in each leg 176, movable platform 170 may accommodate different wall cabinet 164 heights relative to countertop 156. It will be appreciated that a bias mechanism may also be provided in some embodiments to bias pivot mechanism 170 rotationally and/or linearly, and that a damping mechanism, e.g., via one or more cylinders, may also be used to provide controlled movement between the storage and use positions. It may also be desirable to provide a releasable latching mechanism in some embodiments to latch movable platform 170 to fixed base 168 to prevent the movable platform 170 from inadvertently dropping into the use position.

Similar to under-cabinet wireless power system 100, under-cabinet wireless power system 150 may be mounted to an underside 152 of an upper cabinet 154 using a mounting bracket 188 that is secured to wall cabinet 154 using a plurality of fasteners 190 (e.g., screws or bolts). Fixed base 168 may then be attached to mounting bracket 188, e.g., through snap-in tabs, fasteners, magnets, rails, etc. In addition, where under-cabinet wireless power system 150 is powered through a power cord 160, extra power cord may be wrapped around mounting bracket 188 and/or fixed base 168. Furthermore, when power cord 160 extends to fixed base 168, some or all of the electrical components, other than wireless power transmitter 172, may be disposed in fixed base 168, and a cable (not shown) may extend between fixed base 168 and wireless power transmitter 172 to power the wireless power transmitter. Such a cable may be implemented in a number of manners, e.g., using a coiled cord that surrounds one of legs 176 and stretches as the legs extend, using a spring-retractable reel to feed cord between the fixed base and the movable platform, using an internally-routed cord, or in other manners that will be appreciated by those of ordinary skill having the benefit of the instant disclosure.

In use, under-cabinet wireless power system 150 is normally stored in the configuration illustrated in FIG. 7, with movable platform 170 nested within fixed base 168 and pivot mechanism 174 collapsed and folded in upon itself. When it is desired to power a wirelessly powered appliance, and as illustrated in FIG. 8, pivot mechanism 174 may be unfolded to orient movable platform 170 into a generally parallel relationship with countertop 156, and legs 176 may be extended if desired to bring movable platform 170 into contact with countertop 156. A wirelessly powered appliance 192 may be positioned on movable platform 170 with its wireless power receiver 194 aligned with wireless power transmitter 172. Power may then be supplied to the wirelessly powered appliance 192, e.g., automatically after detection of wireless power receiver 194 by wireless power transmitter 172, or manually after user selection of an "on" function supported by under-cabinet wireless power system 100 or wirelessly powered appliance 192. Once use of wirelessly powered appliance 192 is complete, wirelessly powered appliance 192 may be removed from movable platform 170 and pivot mechanism 174 may again be folded up to nest movable platform 170 into fixed base 168.

Figure 9:
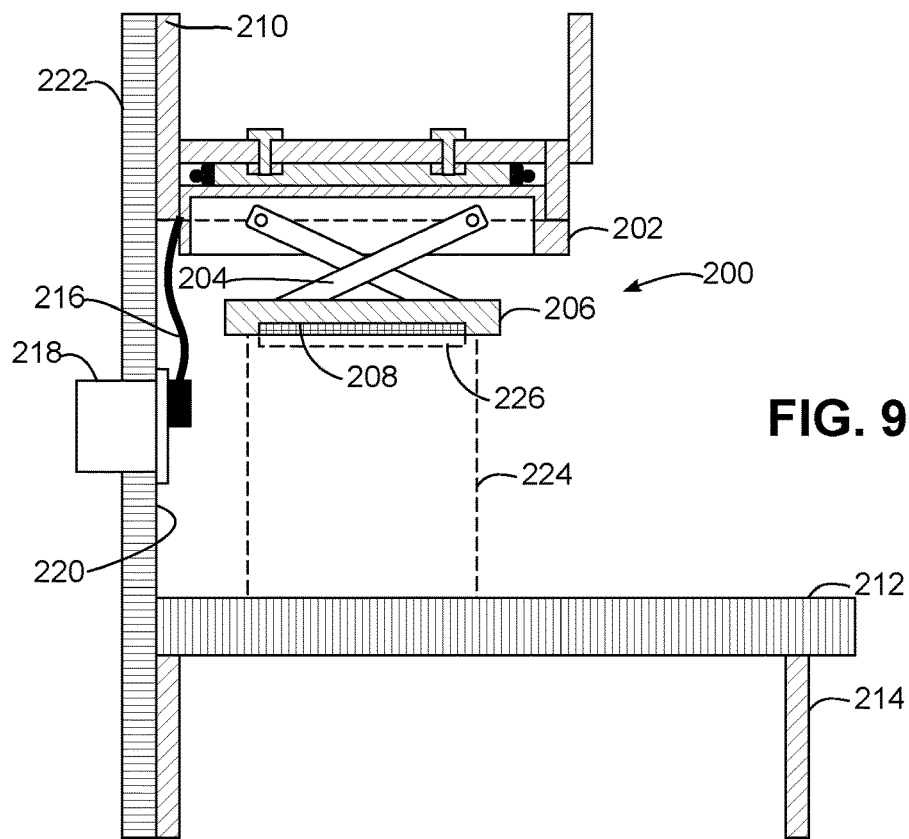
FIG. 9 is a side cross sectional view of another example pull-down under-cabinet wireless power system consistent with some embodiments of the invention, and used for providing wireless power through the top of a wirelessly powered appliance.
Figure 10:
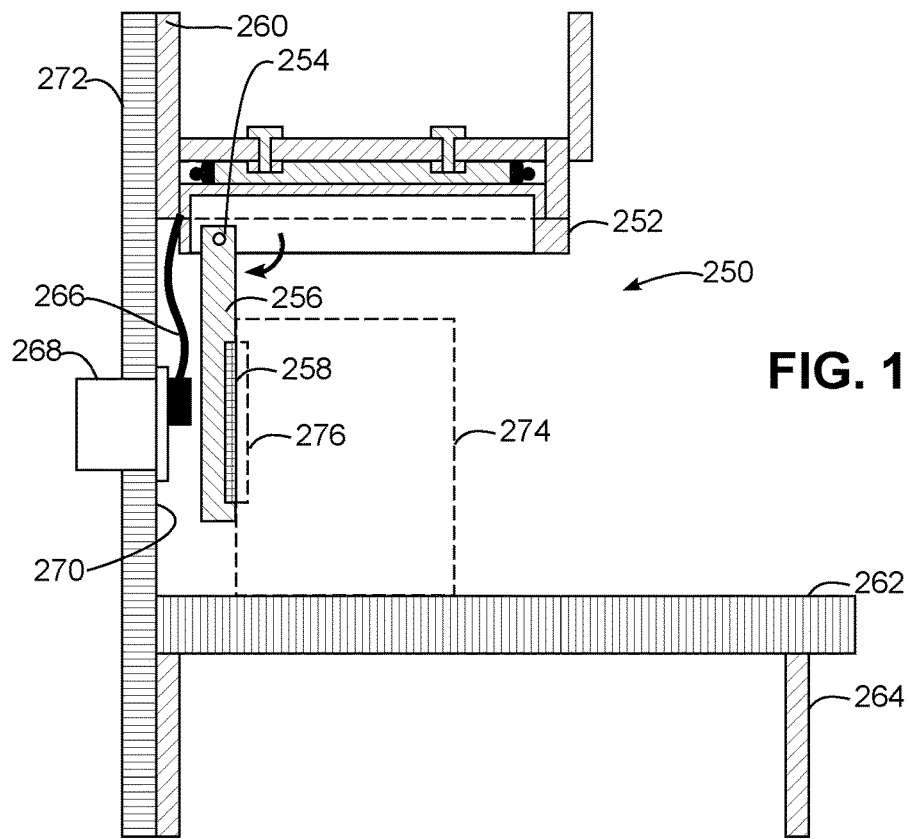
FIG. 10 is a side cross sectional view of another example tilt-out under-cabinet wireless power system consistent with some embodiments of the invention, and used for providing wireless power through the side of a wirelessly powered appliance.

Next, turning to FIGS. 9 and 10, it will be appreciated that a under-cabinet wireless power system consistent with the invention may also be configured to provide wireless power to a wirelessly powered appliance having wireless power receivers disposed at different locations and/or in different orientations on the wirelessly powered appliance. FIG. 9, in particular, illustrates another pull-down under-cabinet wireless power system 200 similar to under-cabinet wireless power system 100, including a fixed base 202 joined through a scissors mechanism 204 to a movable platform 206 having a wireless power transmitter 208. Fixed base 202 is mounted to an underside of an upper or wall cabinet 210 positioned above a countertop 212 supported by a base cabinet 214, and is supplied with power by a power cord 216 that is plugged in to an electrical outlet 218 positioned on a backsplash 220 of a wall 222 to which wall cabinet 210 is mounted.

Rather than having an upwardly-facing wireless power transmitter to oppose and provide power to a downwardly-facing wireless power receiver of a wirelessly powered appliance, as is the case with under-cabinet wireless power system 100, wireless power transmitter 208 is downwardly-facing to provide power to a wirelessly powered appliance 224 having an upwardly-facing wireless power receiver 226 opposing wireless power transmitter 208.

Similarly, FIG. 10 illustrates another tilt-out under-cabinet wireless power system 250 similar to under-cabinet wireless power system 150, including a fixed base 252 joined through a rotatable coupling 254 to a movable platform 256 having a wireless power transmitter 258. Fixed base 252 is mounted to an underside of an upper or wall cabinet 260 positioned above a countertop 262 supported by a base cabinet 264, and is supplied with power by a power cord 266 that is plugged in to an electrical outlet 268 positioned on a backsplash 270 of a wall 272 to which wall cabinet 260 is mounted.

Rather than having an upwardly-facing wireless power transmitter to oppose and provide power to a downwardly-facing wireless power receiver of a wirelessly powered appliance, as is the case with under-cabinet wireless power system 150, wireless power transmitter 258 is side-facing to provide power to a wirelessly powered appliance 274 having a side-facing wireless power receiver 276 opposing wireless power transmitter 258, e.g., on a back panel thereof.

Figure 11:
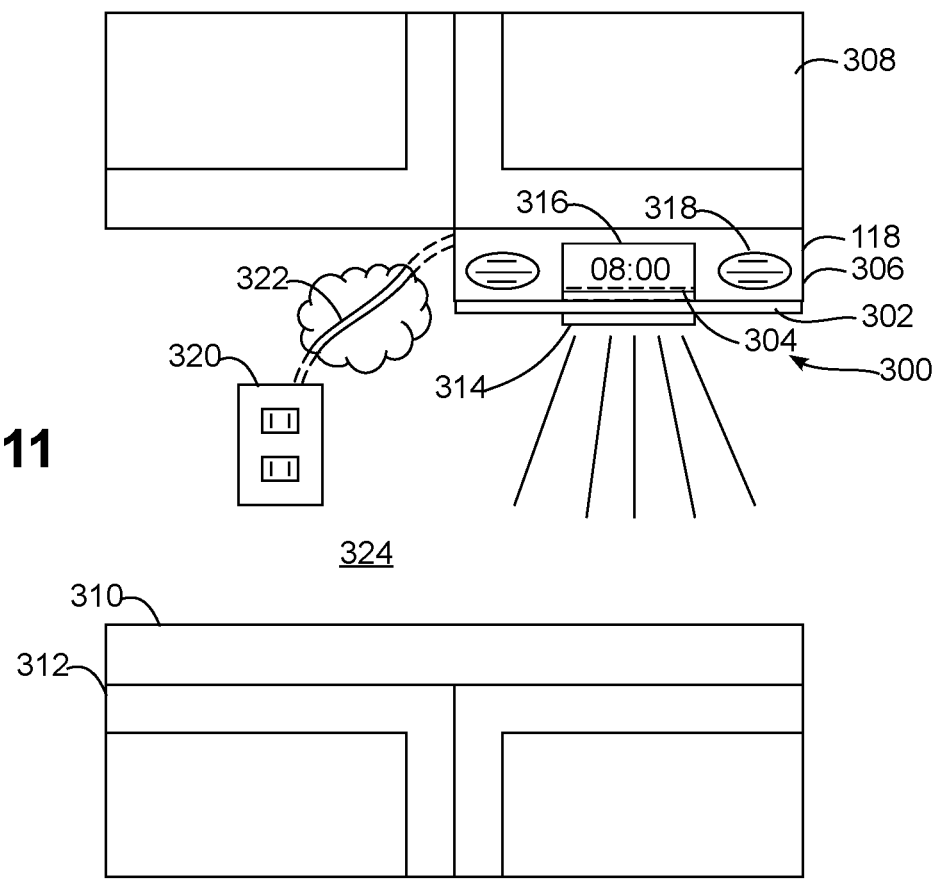
FIG. 11 is a front elevational view of another example under-cabinet wireless power system consistent with some embodiments of the invention, and including various secondary functions.

FIG. 11 illustrates another under-cabinet wireless power system 300, which includes various secondary functions that may be implemented in different embodiments. Specifically under-cabinet wireless power system 300 of FIG. 11 is illustrated in a storage position, with a movable platform 302 including a wireless power transmitter 304 nested within a fixed base 306 that is secured to an underside of an upper or wall cabinet 308 positioned above a countertop 310 supported by a base cabinet 312.

Under-cabinet wireless power system 300 in the illustrated embodiment supports a number of secondary functions, including, for example, a light 314 mounted to an underside of movable platform 302, and which may be operated manually, based on motion, based upon a timer, and/or based upon a light sensor. A display 316 may also be provided on fixed base 306, e.g., to display a clock, a timer, weather information, smart assistant information, audio playback information, etc. A user interface, which may be implemented using a touch screen implementation of display 316 and/or using one or more physical user controls, may also be used to control various secondary functions, and audio information may be conveyed by an audio system, represented by speakers 318. It will be appreciated, for example, that under-cabinet wireless power system 300 may provide a smart assistant function in some embodiments, and may be configured to present audio and/or video information to a user in some embodiments. An innumerable number of other secondary functions may be supported in other embodiments, and it will be appreciated that any of the aforementioned secondary functions may be implemented collectively or individually in different embodiments. It will also be appreciated that secondary functions are generally used principally when the wireless power transmitter is not active and/or when the movable platform is in the storage position. However, such secondary functions, in some instances, may still be used when the wireless power transmitter is active and/or when the movable platform is in the use position.

FIG. 11 also illustrates another variation, whereby rather than being powered by a power cord plugged in to an electrical outlet 320, under-cabinet wireless power system 300 may be hard-wired to an electrical circuit, as represented by wire 322 shown running within wall 324.

It will be appreciated that, while certain features may be discussed herein in connection with certain embodiments and/or in connection with certain figures, unless expressly stated to the contrary, such features generally may be incorporated into any of the embodiments discussed and illustrated herein. Moreover, features that are disclosed as being combined in some embodiments may generally be implemented separately in other embodiments, and features that are disclosed as being implemented separately in some embodiments may be combined in other embodiments, so the fact that a particular feature is discussed in the context of one embodiment but not another should not be construed as an admission that those two embodiments are mutually exclusive of one another. Various additional modifications may be made to the illustrated embodiments consistent with the invention. Therefore, the invention lies in the claims hereinafter appended.

What is claimed is:

1. An under-cabinet wireless power system, comprising:
   a base configured to mount to an underside of a wall cabinet that is positioned over a countertop; and
   a wireless power transmitter supported on the underside of the wall cabinet by the base and configured to receive power from a wired power source, the wireless power transmitter further configured to generate a wireless power signal to power a wirelessly powered appliance that is positioned on or proximate to the countertop and that includes a wireless power receiver positioned in an opposing relationship with the wireless power transmitter.

2. The under-cabinet wireless power system of claim 1, further comprising a movable platform movably coupled to the base, wherein the wireless power transmitter is disposed on the movable platform.

3. The under-cabinet wireless power system of claim 2, wherein the movable platform is at least partially linearly movable relative to the base.

4. The under-cabinet wireless power system of claim 3, further comprising a scissors mechanism coupling the movable platform to the base.

5. The under-cabinet wireless power system of claim 2, wherein the movable platform is at least partially pivotably movable relative to the base.

6. The under-cabinet wireless power system of claim 5, further comprising at least one rotatable coupling configured to pivot the movable platform relative to the base.

7. The under-cabinet wireless power system of claim 5, wherein the at least one rotatable coupling includes a first rotatable coupling pivotably coupling the movable platform to the base.

8. The under-cabinet wireless power system of claim 5, further comprising a pivot mechanism disposed intermediate the base and the movable platform and including the at least one rotatable coupling, wherein the at least one rotatable coupling includes a first rotatable coupling pivotably coupling the pivot mechanism to the base proximate a first opposing end of the pivot mechanism and a second rotatable coupling pivotably coupling the pivot mechanism to the movable platform proximate a second opposing end of the pivot mechanism.

9. The under-cabinet wireless power system of claim 8, wherein the pivot mechanism includes at least one extendible leg extending between the base and the movable platform.

10. The under-cabinet wireless power system of claim 2, wherein the movable platform is movable between a storage position and a use position.

11. The under-cabinet wireless power system of claim 10, wherein the wireless power receiver of the wirelessly powered appliance is downwardly-facing, and when in the use position the wireless power transmitter is upwardly-facing to oppose the downwardly-facing wireless power receiver of the wirelessly powered appliance.

12. The under-cabinet wireless power system of claim 10, wherein the wireless power receiver of the wirelessly powered appliance is upwardly-facing, and when in the use position the wireless power transmitter is downwardly-facing to oppose the upwardly-facing wireless power receiver of the wirelessly powered appliance.

13. The under-cabinet wireless power system of claim 10, wherein the wireless power receiver of the wirelessly powered appliance is side-facing, and when in the use position the wireless power transmitter is side-facing to oppose the side-facing wireless power receiver of the wirelessly powered appliance.

14. The under-cabinet wireless power system of claim 10, wherein when in the storage position at least a portion of the movable platform nests within the base.

15. The under-cabinet wireless power system of claim 14, wherein at least a portion of the base nests within a downwardly-facing enclosed area of the wall cabinet formed in part by a face frame of the wall cabinet.

16. The under-cabinet wireless power system of claim 1, further comprising a power cord configured to supply power to the wireless power transmitter from a wall-mounted electrical outlet.

17. The under-cabinet wireless power system of claim 1, further comprising a mounting bracket configured to mount the base to the underside of the wall cabinet.

18. The under-cabinet wireless power system of claim 1, further comprising a secondary function configured for use when the wireless power transmitter is not active.

19. The under-cabinet wireless power system of claim 18, wherein the secondary function comprises an on/off light, a motion activated light, a timed light, a light sensor-activated light, a smart assistant, a video system, a display, a touch-screen display, a clock, a timer, or an audio system.

20. The under-cabinet wireless power system of claim 1, further comprising a user interface and a controller configured to operate the user interface and the wireless power transmitter, wherein the controller is further configured to control a functional operation of the wirelessly powered appliance using the interface.

* * * * *